US010867886B2

(12) United States Patent
Lin

(10) Patent No.: US 10,867,886 B2
(45) Date of Patent: Dec. 15, 2020

(54) FEMALE FASTENER HOLDER FOR FIXING STRUCTURE AND FIXING STRUCTURE FOR HEAT DISSIPATION ASSEMBLY

(71) Applicant: ASIA VITAL COMPONENTS CO., LTD., New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 16/384,946

(22) Filed: Apr. 16, 2019

(65) Prior Publication Data

US 2020/0235036 A1    Jul. 23, 2020

(30) Foreign Application Priority Data

Jan. 22, 2019  (TW) .............................. 108102354 A

(51) Int. Cl.
*H05K 7/20*    (2006.01)
*H01L 23/40*   (2006.01)
(Continued)

(52) U.S. Cl.
CPC ........ *H01L 23/4093* (2013.01); *H01L 23/427* (2013.01); *H05K 1/0203* (2013.01);
(Continued)

(58) Field of Classification Search
CPC . H01L 23/4093; H01L 23/427; H05K 1/0203; H05K 2201/064;
(Continued)

(56) References Cited

U.S. PATENT DOCUMENTS 5,384,940 A *  1/1995  Soule .................. H01L 23/4093
                                                      24/453
5,870,286 A *  2/1999  Butterbaugh ....... H01L 23/4093
                                                      165/80.2
(Continued)

FOREIGN PATENT DOCUMENTS

CN   101568246 A   10/2009
JP     6019238 B2   11/2016
TW     I599756 B    9/2017

*Primary Examiner* — Anatoly Vortman
(74) *Attorney, Agent, or Firm* — Thomas J. Nikolai; DeWitt LLP

(57) ABSTRACT

A fixing structure for heat dissipation assembly includes a base and multiple female fastener holders. The base has at least one through bore axially extending through an upper and a lower surface thereof, as well as coupling holes located outside the through bore and respectively having an engaging element disposed therein. The female fastener holder has a lower side formed with coupling protrusions corresponding to the coupling holes. The coupling protrusion has a guiding groove radially provided thereon and having a lower and an upper end recess for engaging with the engaging element in the corresponding coupling hole. The engaging elements in the coupling holes are guided by the guiding grooves to move from the lower to the upper recesses when the female fastener holder is turned relative to the through bore and the coupling holes on the base, bringing the coupling protrusions to axially insert into the coupling holes.

16 Claims, 12 Drawing Sheets

(51) Int. Cl.
*H01L 23/427* (2006.01)
*H05K 1/02* (2006.01)

(52) U.S. Cl.
CPC ......... *H05K 7/20* (2013.01); *H05K 2201/064* (2013.01); *H05K 2201/10393* (2013.01); *H05K 2201/10424* (2013.01)

(58) Field of Classification Search
CPC .......... H05K 2201/10393; H05K 2201/10424; H05K 7/20
USPC .......... 361/719, 709, 710, 679.54; 257/727; 165/80.2, 80.3
See application file for complete search history.

(56) References Cited

U.S. PATENT DOCUMENTS

| | | | | |
|---|---|---|---|---|
| 6,055,159 A * | 4/2000 | Sun | H01L 23/4093 | 165/185 |
| 6,304,452 B1 * | 10/2001 | Lo | H01L 23/4093 | 165/80.2 |
| 6,307,748 B1 * | 10/2001 | Lin | H01L 23/4093 | 165/80.3 |
| 6,331,937 B1 * | 12/2001 | Bartyzel | H01L 23/4093 | 257/718 |
| 6,392,889 B1 * | 5/2002 | Lee | H01L 23/4093 | 165/80.3 |
| 6,475,030 B1 * | 11/2002 | Chang | H01L 23/4093 | 257/E23.086 |
| 6,545,879 B1 * | 4/2003 | Goodwin | H05K 7/1053 | 361/688 |
| 6,557,675 B2 * | 5/2003 | Iannuzzelli | F16F 7/1028 | 188/380 |
| 6,666,640 B1 * | 12/2003 | Hsieh | F16B 5/065 | 165/80.3 |
| 6,679,712 B2 * | 1/2004 | Chang | H01L 23/4093 | 257/E23.086 |
| 6,697,256 B1 * | 2/2004 | Horng | H01L 23/4093 | 257/719 |
| 6,786,691 B2 * | 9/2004 | Alden, III | F16B 35/041 | 411/352 |
| 6,826,054 B2 * | 11/2004 | Liu | H01L 23/4006 | 257/719 |
| 6,930,884 B2 * | 8/2005 | Cromwell | H01L 23/4093 | 257/718 |
| 6,950,306 B2 * | 9/2005 | Huang | H01L 23/467 | 257/706 |
| 7,042,727 B2 * | 5/2006 | Ulen | H01L 23/4006 | 165/80.3 |
| 7,126,823 B2 * | 10/2006 | Chen | H01L 23/4093 | 361/702 |
| 7,133,288 B2 * | 11/2006 | DelPrete | H01L 23/4093 | 361/719 |
| 7,161,808 B2 * | 1/2007 | Atkinson | H01L 23/4006 | 24/457 |
| 7,167,370 B2 * | 1/2007 | Lee | H01L 23/4093 | 24/294 |
| 7,180,743 B2 * | 2/2007 | Chen | H01L 23/4093 | 165/185 |
| 7,209,354 B2 * | 4/2007 | Wu | H01L 23/4093 | 257/706 |
| 7,310,229 B2 * | 12/2007 | Lee | H01L 23/4093 | 257/718 |
| 7,342,796 B2 * | 3/2008 | Aukzemas | F16B 37/145 | 165/185 |
| 7,359,200 B2 * | 4/2008 | Zhou | H01L 23/4006 | 165/80.3 |
| 7,430,122 B2 * | 9/2008 | Li | H01L 23/4093 | 165/104.33 |
| 7,474,530 B2 * | 1/2009 | Stewart | H01L 23/4006 | 165/104.33 |
| 7,474,532 B1 * | 1/2009 | Desrosiers | H01L 23/4006 | 165/185 |
| 7,576,989 B2 * | 8/2009 | Li | H01L 23/4093 | 165/185 |
| 7,729,122 B2 * | 6/2010 | Wong | H01L 23/4093 | 361/679.54 |
| 7,869,217 B2 * | 1/2011 | Chen | H01L 23/4093 | 165/80.2 |
| 7,924,566 B2 * | 4/2011 | Nie | G06F 1/20 | 165/80.2 |
| 7,957,147 B2 * | 6/2011 | Ma | H01L 23/4006 | 165/104.33 |
| 8,139,361 B2 * | 3/2012 | Hager | H05K 3/308 | 174/260 |
| 8,238,102 B2 * | 8/2012 | Wei | H01L 23/36 | 361/679.54 |
| 8,511,956 B2 | 8/2013 | Liu et al. | | |
| 9,345,171 B2 * | 5/2016 | Lin | H05K 7/2039 | |
| 2004/0105236 A1 * | 6/2004 | Lee | H01L 23/4093 | 361/704 |
| 2004/0253077 A1 * | 12/2004 | Aoki | G06F 1/20 | 411/508 |
| 2005/0111192 A1 * | 5/2005 | Lee | H01L 23/4093 | 361/704 |
| 2006/0007659 A1 * | 1/2006 | Lee | H01L 23/4006 | 361/704 |
| 2006/0275100 A1 * | 12/2006 | Aukzemas | F16B 37/145 | 411/353 |
| 2007/0217159 A1 * | 9/2007 | Long | H01L 23/4093 | 361/704 |
| 2008/0158827 A1 * | 7/2008 | Yang | H01L 23/4093 | 361/719 |

\* cited by examiner

FEMALE FASTENER HOLDER FOR FIXING STRUCTURE AND FIXING STRUCTURE FOR HEAT DISSIPATION ASSEMBLY

This application claims the priority benefit of Taiwan patent application number 108102354 filed on Jan. 22, 2019.

FIELD OF THE INVENTION

The present invention relates to a fixing structure, and more particularly, to a fixing structure for heat dissipation assembly, as well as to a female fastener holder for the fixing structure.

BACKGROUND OF THE INVENTION

Different kinds of electronic elements are mounted in an electronic device to provide different functions. Among others, electronic elements that are responsible for computing, such as the central processing unit (CPU) and other chips, will produce a large amount of heat when they operate. To avoid burn-out CPU or chips, additional heat dissipation elements are needed to quickly remove the produced heat.

Common heat dissipation elements include radiators, vapor chambers, radiation fin assemblies and the like. These heat dissipation elements and the heat-producing chips, CPU or other heat sources must be in tight contact with one another without leaving any clearance or gap between them, so as to avoid thermal resistance between them and facilitate efficient heat transfer and removal from the heat sources to the heat dissipation elements. Normally, a heat dissipation element is screw-fastened to a motherboard. More specifically, male fastening units are extended through the motherboard from one side to another side thereof to engage with nuts that have female threads and are provided on the heat dissipation element, so that the heat dissipation element is fixedly connected to the motherboard. The nuts are usually temporarily mounted on the heat dissipation element via nut/washer units to avoid the risk of falling off the heat dissipation element. The nut/washer units are made of a plastic material and respectively include at least two extended bosses, which are extended through bores correspondingly preformed on the heat dissipation element. Free ends of the bosses are then molten at a high temperature and flattened to form stop sections, which prevent the extended bosses from being extracted out of the heat dissipation element, so that the nuts and washers are fixedly connected to the heat dissipation element.

However, the use of the extended bosses has the following disadvantages: time is required to melt, cool and set the free ends of the bosses; burrs tend to occur on the bosses after the melting process and require additional time to remove them; complicate manufacturing procedures are involved; and no rework is possible. It is therefore tried by the inventor to eliminate the above disadvantages by developing a fixing structure for heat dissipation assembly and a female fastener holder for the fixing structure.

SUMMARY OF THE INVENTION

A primary object of the present invention is to provide a fixing structure for heat dissipation assembly that can be easily assembled to and disassembled from a heat dissipation assembly.

Another object of the present invention is to provide a fixing structure for heat dissipation assembly that facilitates easy assembling of a nut to a base of the heat dissipation assembly for engaging with a male fastening element on a circuit board.

A further object of the present invention is to provide a female fastener holder for the above fixing structure, so as to enable easy assembling of a female fastener to the base of the heat dissipation assembly for engaging with the male fastening element on the circuit board.

To achieve the above and other objects, the fixing structure for heat dissipation assembly according to the present invention includes a base and at least one female fastener holder. The base has an upper surface and a lower surface, and is provided with at least one through bore and a plurality of coupling holes. The at least one through bore axially extends through the upper surface and the lower surface; and the coupling holes are located at two outer sides of the through bore and respectively have an engaging element horizontally disposed therein. The female fastener holder includes a main body having an upper side and a lower side. The main body is formed on the lower side with a plurality of coupling protrusions corresponding to the coupling holes on the base. The coupling protrusions respectively have a guiding groove provided thereon for engaging with the engaging element in the corresponding coupling hole. Each of the guiding grooves has two opposite lower and upper ends, at where a lower recess and an upper recess are formed, respectively, such that each of the guiding grooves is radially provided on the coupling protrusion to spirally extend from the lower recess to the upper recess. The engaging elements in the coupling holes are guided by the guiding grooves on the coupling protrusions to move from the lower recesses to the upper recesses when the main body of the female fastener holder is aligned with and turned relative to the through bore and the coupling holes on the base, such that the coupling protrusions are axially inserted into the coupling holes and the lower side of the main body of the female fastener holder is pressed against the upper surface of the base.

The through bore is formed on each of four corners of the base.

The main body of the female fastener holder is formed on the upper side with a raised wall portion that encloses a holding space for holding a female fastener therein. The raised wall portion is provided with a plurality of limiting elements for interfering with the female fastener. The main body has a communicating bore axially extending through the upper side and the lower side to communicate with the holding space, such that a male fastener can be extended through the communicating bore to thread into the female fastener.

The coupling holes are arcuate in shape, and the coupling protrusions are also arcuate in shape to correspond to the arcuate coupling holes.

The guiding groove can be further provided between the lower recess and the upper recess with at least one middle recess.

The main body of the female fastener holder further has a pivot groove and an elastic element provided thereon. The pivot groove is formed on the lower side of the main body adjacent to one outer edge thereof. The elastic element includes a pivoting section, a handling section and a hooking section. The pivoting section is pivotally received in the pivot groove; the handling section is extended from an end of the pivoting section and has a free end, which is also pivotally received in the pivot groove; and the hooking section is extended from another end of the pivoting section.

The lower side of the base is fitly attached to a heat-producing element on a motherboard. The motherboard has a base frame provided thereon to enclose the heat-producing element therein. The base frame is provided with a plurality of retaining hooks and a plurality of connecting elements; and the retaining hooks are respectively engaged with the hooking section of one of the elastic elements.

The base further includes a plurality of radiation fins or heat pipes provided on the upper surface.

The base can be formed of a piece of solid heat conducting metal, a vapor chamber or a flat heat pipe. The vapor chamber and the flat heat pipe internally define a receiving chamber, in which a wick structure and a working fluid are provided.

To achieve the above and other objects, the female fattener holder for fixing structure provided according to the present invention includes a main body having an upper side, a lower side, and a communicating bore. The upper side is formed with a raised wall portion that encloses a holding space for holding a female fastener therein and is provided with a plurality of limiting elements for interfering with the female fastener. The lower side is formed with a plurality of coupling protrusions, which respectively have a guiding groove provided thereon. The guiding grooves respectively have two opposite lower and upper ends, at where a lower recess and an upper recess are formed, respectively, such that each of the guiding grooves is radially extended on the coupling protrusion to extend from the lower recess to the upper recess. The communicating bore is axially extended through the upper side and the lower side to communicate with the holding space, such that a male fastener can be extended through the communicating bore to thread into the female fastener.

More specifically, the guiding groove on the coupling protrusion is spirally or obliquely extended from the lower recess to the upper recess.

The guiding groove can be further provided between the lower recess and the upper recess with at least one middle recess.

The main body of the female fastener holder further has a pivot groove and an elastic element provided thereon. The pivot groove is formed on the lower side of the main body adjacent to one outer edge thereof. The elastic element includes a pivoting section, a handling section and a hooking section. The pivoting section is pivotally received in the pivot groove; the handling section is extended from an end of the pivoting section and has a free end, which is also pivotally received in the pivot groove; and the hooking section is extended from another end of the pivoting section.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
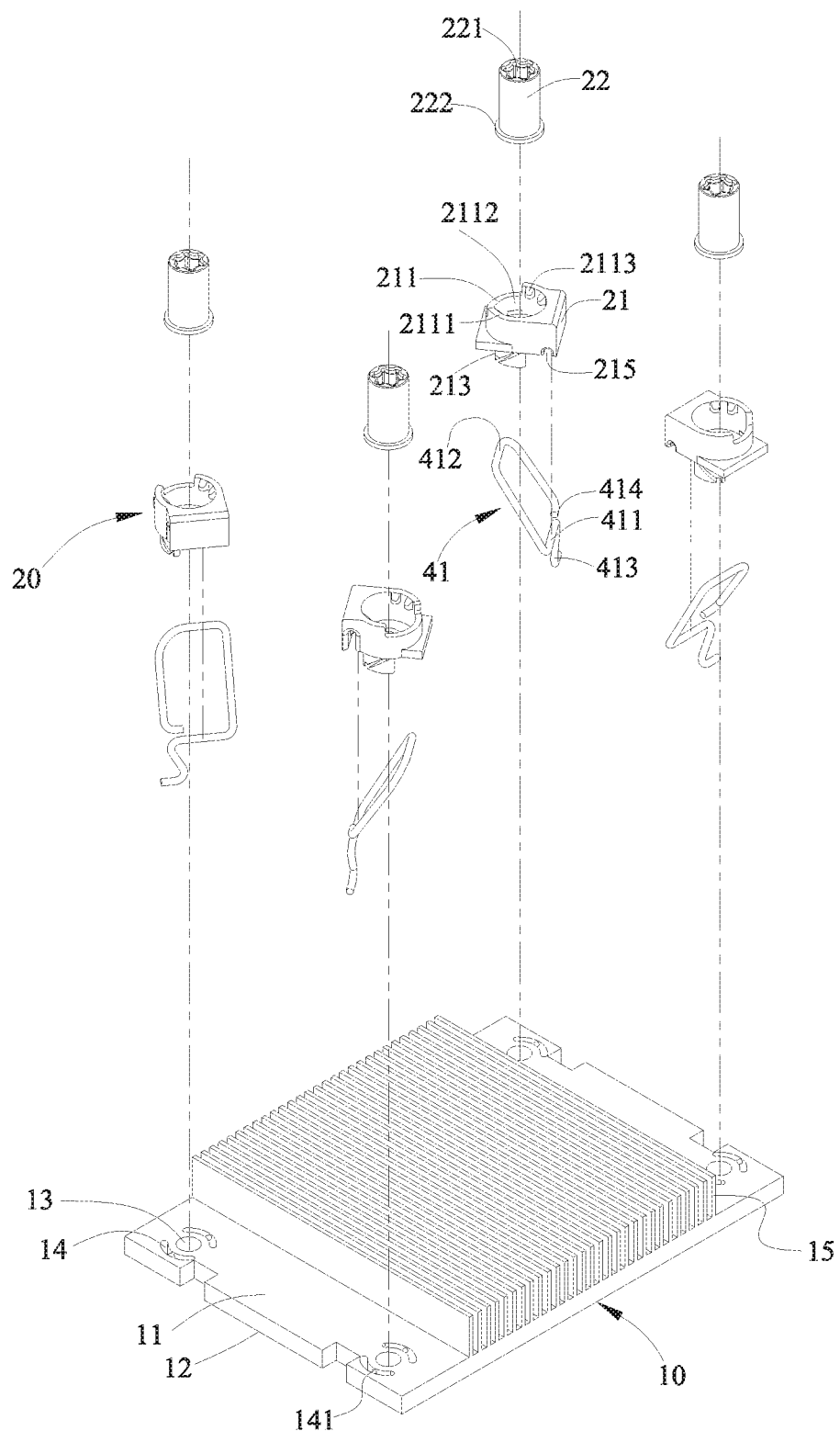
FIG. 1A is an exploded top perspective view showing a preferred embodiment of a fixing structure for heat dissipation assembly according to the present invention.

The present invention will now be described with some preferred embodiments thereof and by referring to the accompanying drawings. For the purpose of easy to understand, elements that are the same in the preferred embodiments are denoted by the same reference numerals.

According a first aspect of the present invention, there is provided a fixing structure for heat dissipation assembly. Herein, the heat dissipation assembly includes a substrate, a heat spreader, a radiator, a water-cooling plate, a vapor chamber or a flat heat pipe having a radiation fin assembly or a heat pipe group connected thereto or mounted thereon. The heat dissipation assembly is in contact with a heat-producing element on a circuit board, such as a central processing unit (CPU), a micro control unit (MCU) or other heat sources, to facilitate quick cooling and accordingly, normal operation of the heat-producing element.

Please refer to FIGS. 1A to 1I, in which a preferred embodiment of the fixing structure for heat dissipation assembly according to the present invention is shown. For the purpose of conciseness and clarity, the fixing structure for heat dissipation assembly is also briefly referred to as the fixing structure herein. As shown, the fixing structure includes a base 10 and at least one female fastener holder 20. The base 10 has an upper surface 11 and a lower surface 12, and is provided with at least one through bore 13 and a plurality of coupling holes 14. The through bore 13 can be, for example, four in number. In this case, the four through bores 13 are separately located at four corners of the base 10 to axially extend through the upper surface 11 and the lower surface 12. Each of the through bores 13 has at least two coupling holes 14 formed on two outer sides thereof. In an embodiment, the coupling holes 14 are through holes axially extended through the upper and lower surfaces 11, 12 of the base 10. However, in other operable embodiments, the coupling holes 14 can be otherwise blind holes axially extended through only the upper surface 11 of the base 10 but not the lower surface 12. The coupling holes 14 respectively have a horizontally or transversely disposed engaging element 141. In an operable embodiment, the engaging element 141 is connected at two ends to two opposite inner walls of the coupling hole 14. However, in other operable embodiments, the engaging element 14 can be otherwise connected at only one end to one inner wall of the coupling hole 14 with the other end being a free end.

Figure 1B:
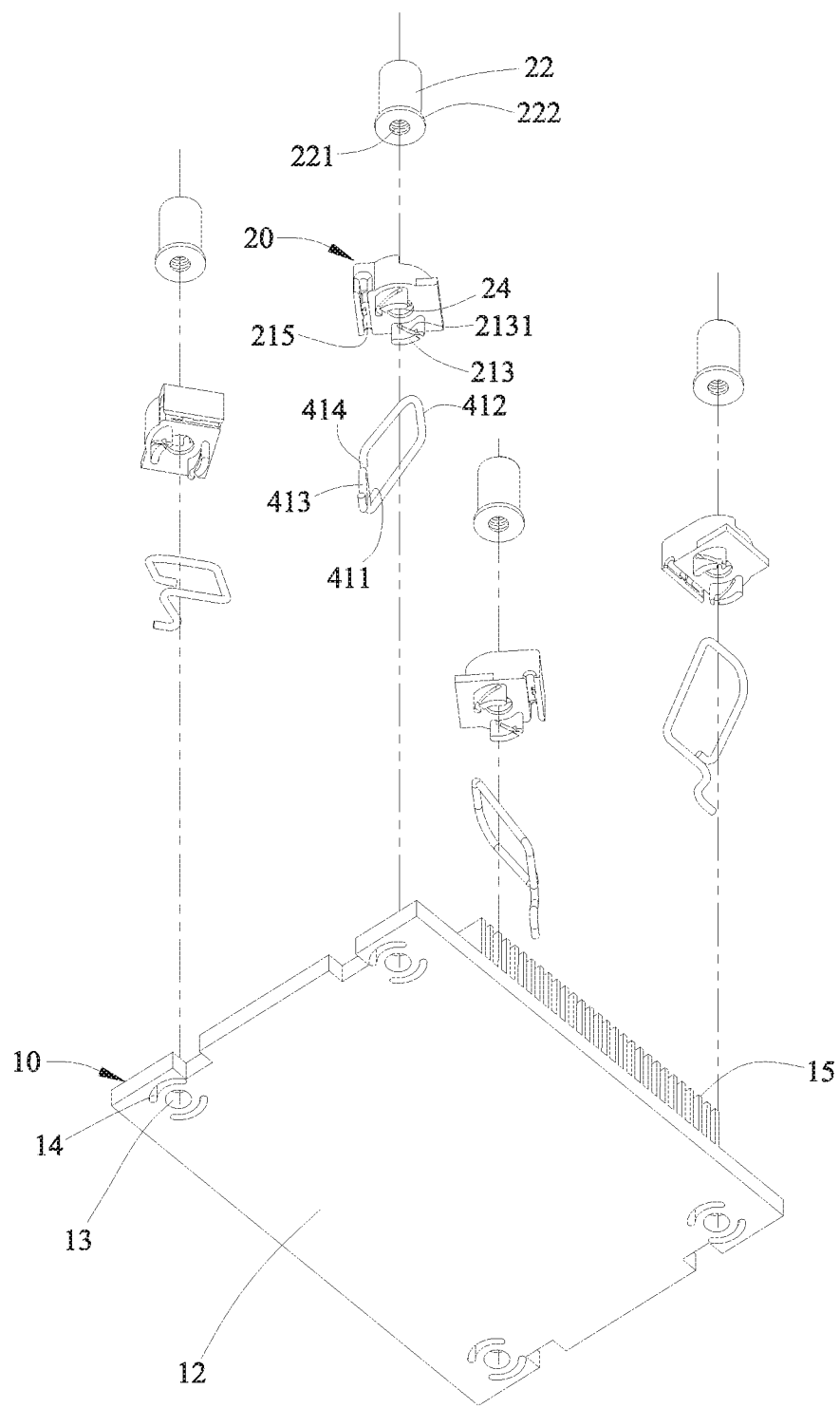
FIG. 1B is an exploded bottom perspective view of the fixing structure for heat dissipation assembly shown in FIG. 1A.
Figure 1C:
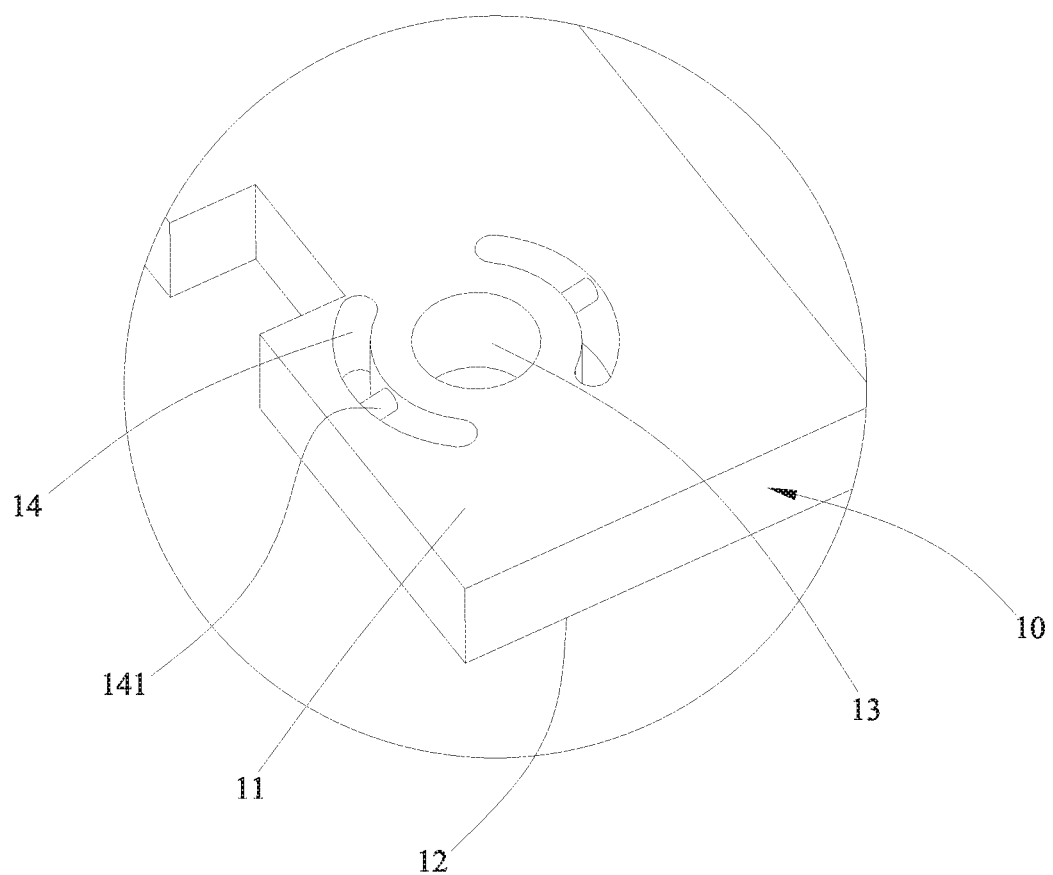
FIG. 1C is an enlarged view of one of four corners of a base for the fixing structure according to the present invention.
Figure 1D:
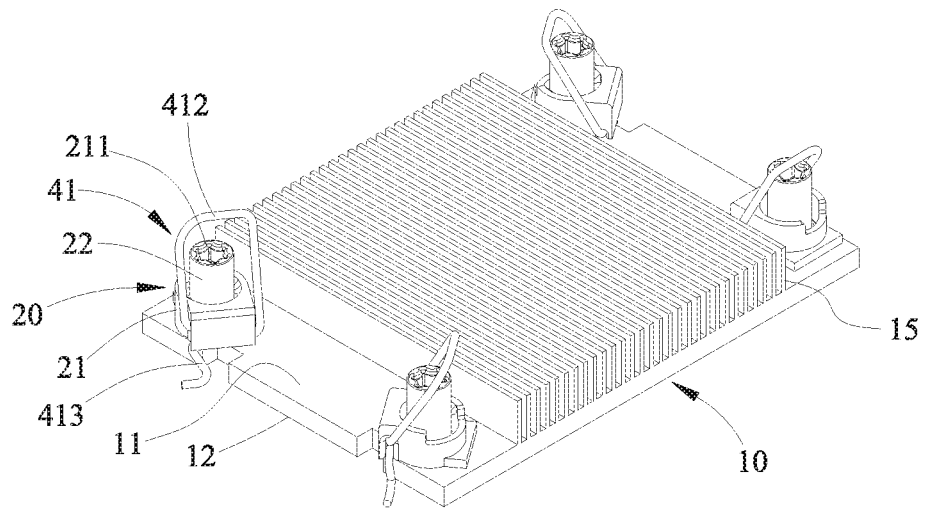
FIG. 1D is an assembled view of FIG. 1A.
Figure 1E:
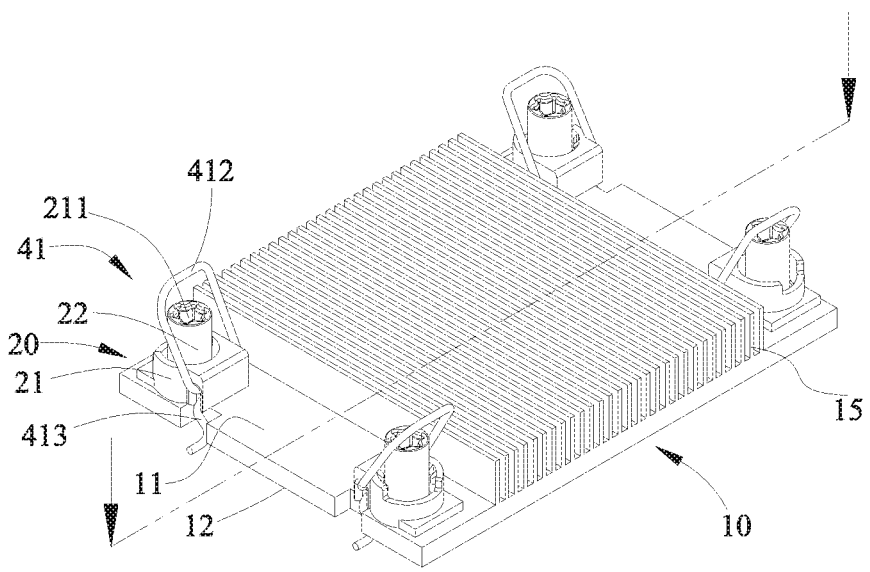
FIG. 1E is another assembled view of FIG. 1A.
Figure 1F:
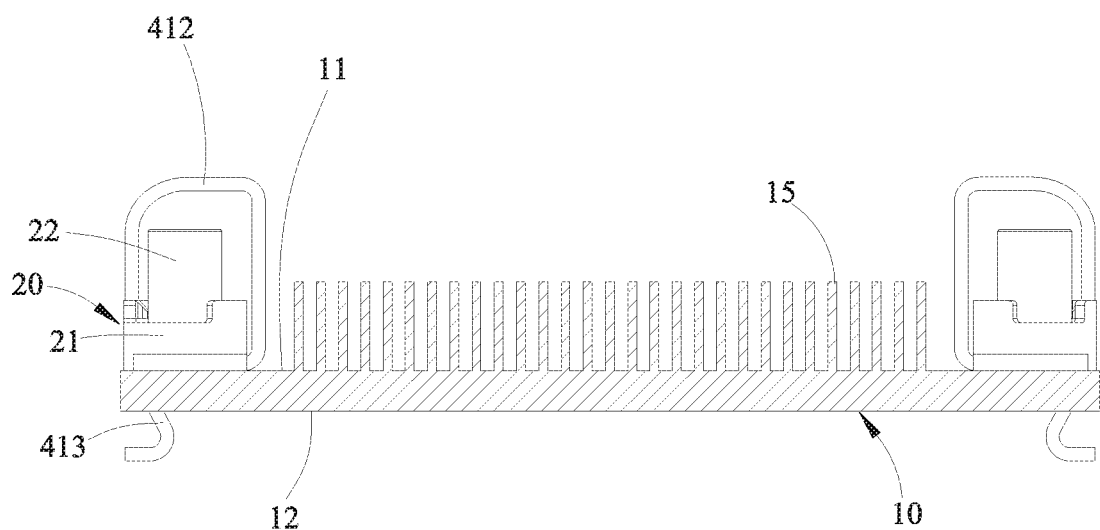
FIG. 1F is an assembled sectional view of a first operable embodiment of the fixing structure according to the present invention.

In a first operable embodiment as shown in FIG. 1F, the base 10 is formed of a piece of solid heat conducting metal, such as a solid piece of gold, silver, copper, aluminum, stainless steel, titanium, commercially pure titanium, or any alloy thereof; and has a plurality of radiation fins 15 provided on the upper surface 11. The radiation fins 15 can be integrally formed with the base 10, as shown in FIG. 1F, or be additionally connected to the base 10. In an alternative embodiment, the base 10 can have at least one heat pipe 16 provided on the upper surface 11, as shown in FIG. 1H.

Figure 1G:
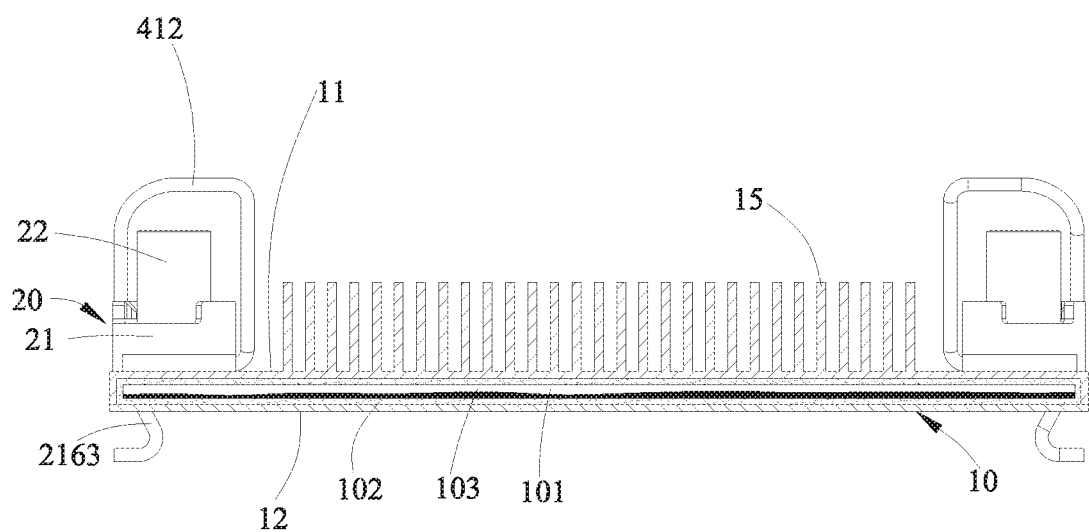
FIG. 1G is an assembled sectional view of a second operable embodiment of the fixing structure according to the present invention.
Figure 1H:
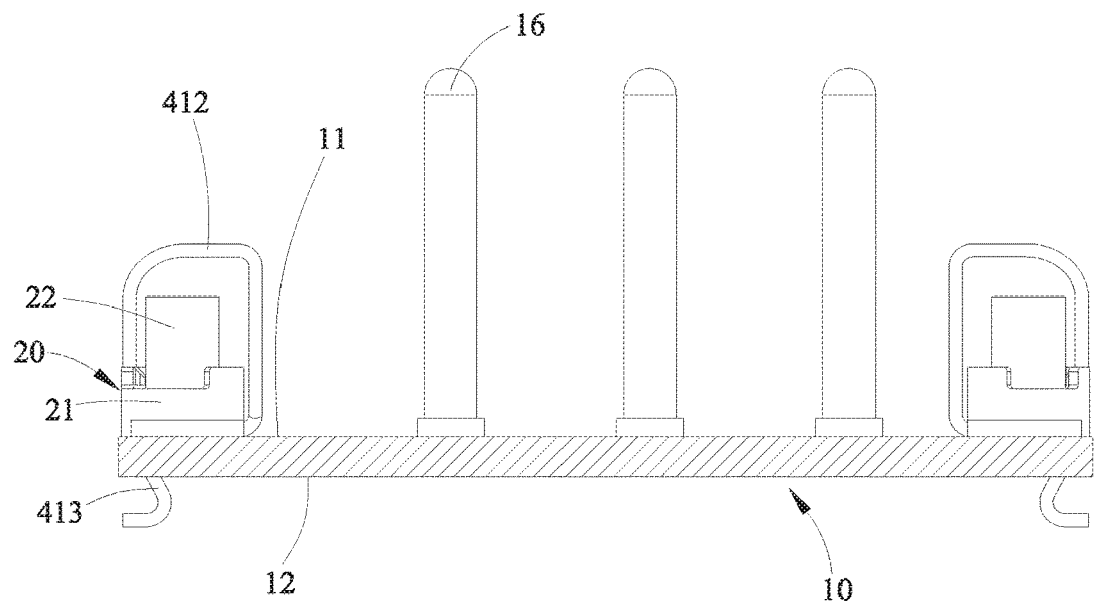
FIGS. 1H and 1I are assembled sectional views showing another two operable embodiments of the fixing structure according to the present invention.
Figure 1I:
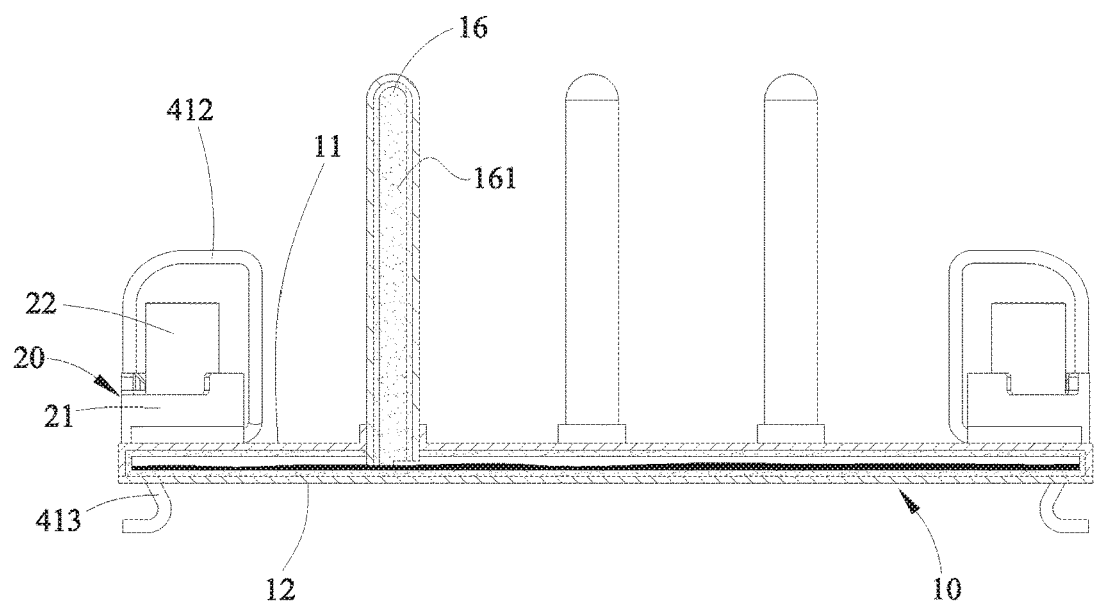

Please refer to FIGS. 1G and 1I. In a second operable embodiment, the base 10 is a vapor chamber or a flat heat pipe internally defining a receiving chamber 101, in which a wick structure 102 and a working fluid 103 are provided. As in the first operable embodiment, the base 10 in the second operable embodiment also has a plurality of radiation fins 15 or heat pipes 16 provided on the upper surface 11. In this case, the heat pipes 16 respectively internally define a heat-pipe chamber 161, which can be communicable or not communicable with the receiving chamber 101 defined in the base 10.

Figure 2A:
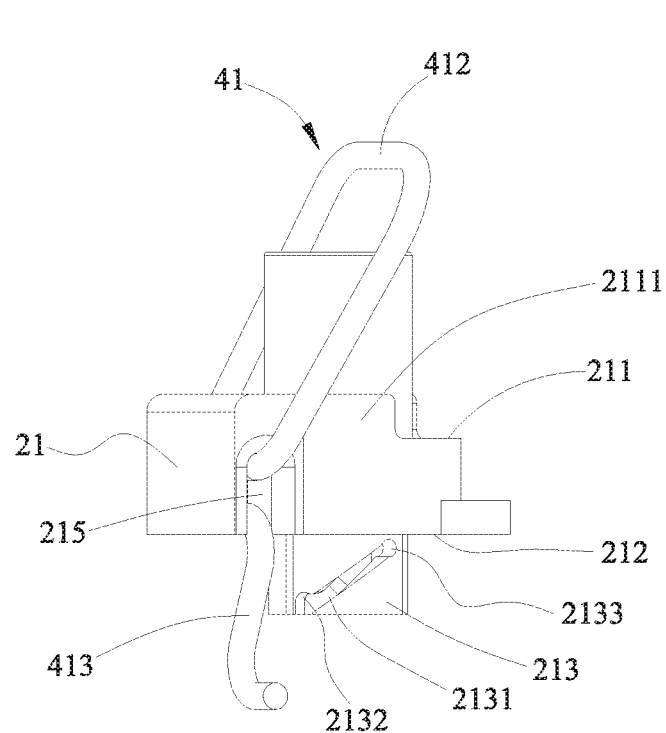
FIG. 2A is a side perspective view of a preferred embodiment of a female fastener holder for fixing structure according to the present invention, which includes a first type of guiding groove.
Figure 2B:
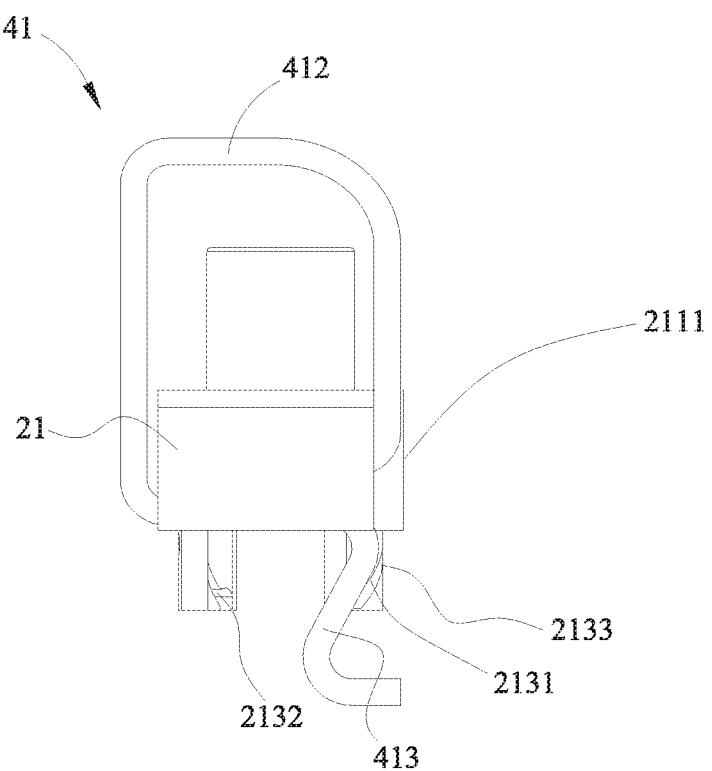
FIG. 2B is a front view of the female fastener holder shown in FIG. 2A.
Figure 2C:
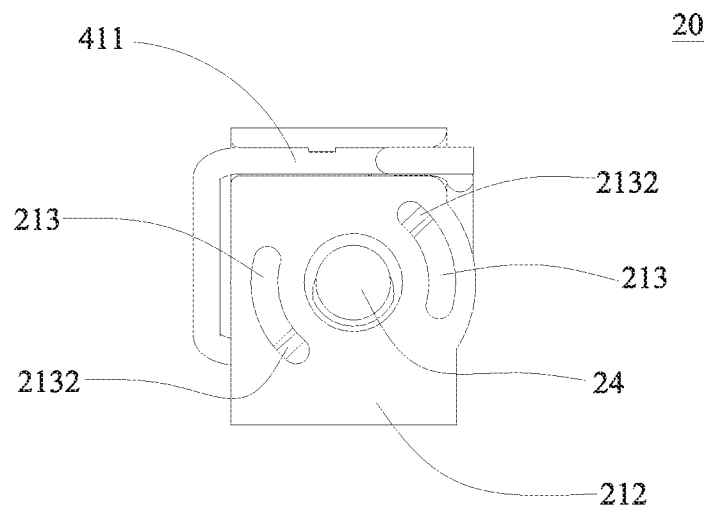
FIG. 2C is a bottom view of the female fastener holder shown in FIG. 2A.

FIGS. 2A, 2B and 2C are side perspective, front and bottom views, respectively, of a preferred embodiment the female fastener holder 20. Please refer to FIGS. 2A, 2B and 2C along with FIGS. 1A, 1B, 1D and 1E. The female fastener holder 20 is a nut seat. In the illustrated preferred embodiment of the fixing structure, there are four pieces of female fastener holders 20 located corresponding to the through bores 13 on the four corners of the base 10. Each of the female fastener holders 20 includes a main body 21 having an upper side 211 and a lower side 212. On the upper side 211 of the main body 21, there is formed a raised wall portion 2111 that encloses a holding space 2112 for holding a female fastener 22 therein. The female fastener 22 can be, for example, a nut, and has an internally threaded bore 221 axially extended therethrough. An end of the female fastener 22, which is the lower end in the illustrated preferred embodiment, has a radially outward extended flange 222 formed therearound. On the raised wall portion 2111 on the main body 21, there is formed a plurality of limiting elements 2113 for interfering with the female fastener 22. In the illustrated preferred embodiment, a pair of limiting elements 2113, such as barbs, is provided on two opposite sides of an inner wall surface of the raised wall portion 2111. The limiting elements 2113 interfere with the flange 222 of the female fastener 22 to prevent the female fastener 22 from, for example, axially upwardly moving out of the holding space 2112. The main body 21 has a communicating bore 24 (see FIGS. 1B and 2C) axially extending through the upper side 211 and the lower side 212 to communicate with the holding space 2112. A male fastener, such as a screw or a threaded rod, can be extended through the communicating bore 24 to thread into the internally threaded bore 221 of the female fastener 22.

On the lower side 212 of the main body 21, there is provided a plurality of axially downward extended coupling protrusions 213 corresponding to the coupling holes 14. In the illustrated preferred embodiment, a pair of coupling protrusions is provided on the lower side 212 corresponding to the two coupling holes 14. The coupling holes 14 formed at two opposite outer sides of each through bore 13 are two corresponding arcuate holes. In other words, the two coupling holes 14 are two corresponding arcuate holes with their inner curved sides facing toward each other. And, the coupling protrusions 213 are also arcuate in shape to correspond to the arcuate coupling holes 14.

Further, each of the coupling protrusions 213 is provided with a guiding groove 2131, which engages with the engaging element 141 in the coupling hole 14. The guiding groove 2131 has a lower end and an upper end, at where a lower recess 2132 and an upper recess 2133 are formed, respectively. More specifically, the guiding groove 2131 is radially provided on the arcuate coupling protrusion 213 to extend spirally or obliquely from the lower recess 2132 to the upper recess 2133.

Figure 3A:
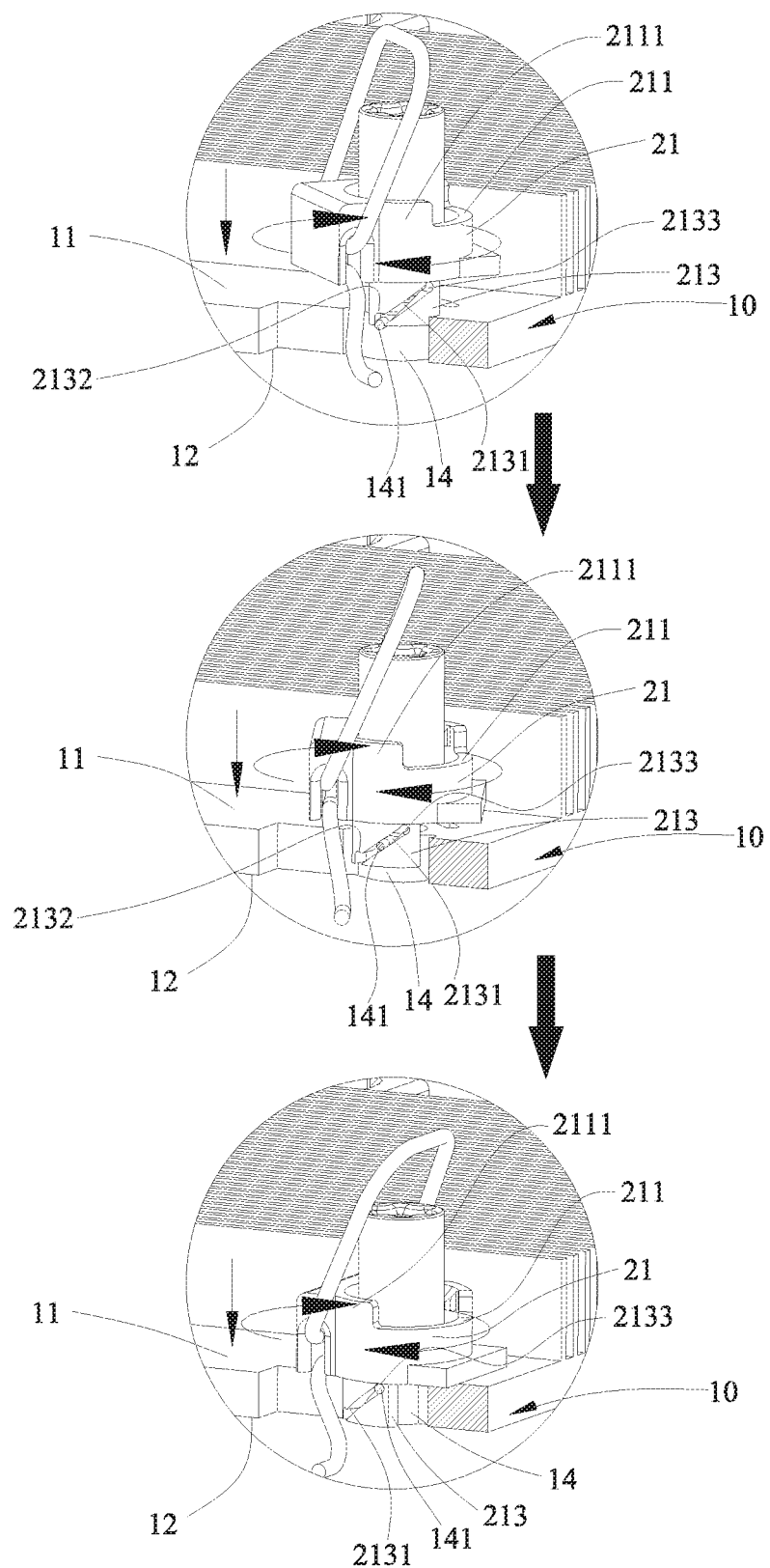
FIG. 3A includes perspective views illustrating how the female fastener holder is connected to the base of the fixing structure for heat dissipation assembly according to the present invention.
Figure 3B:
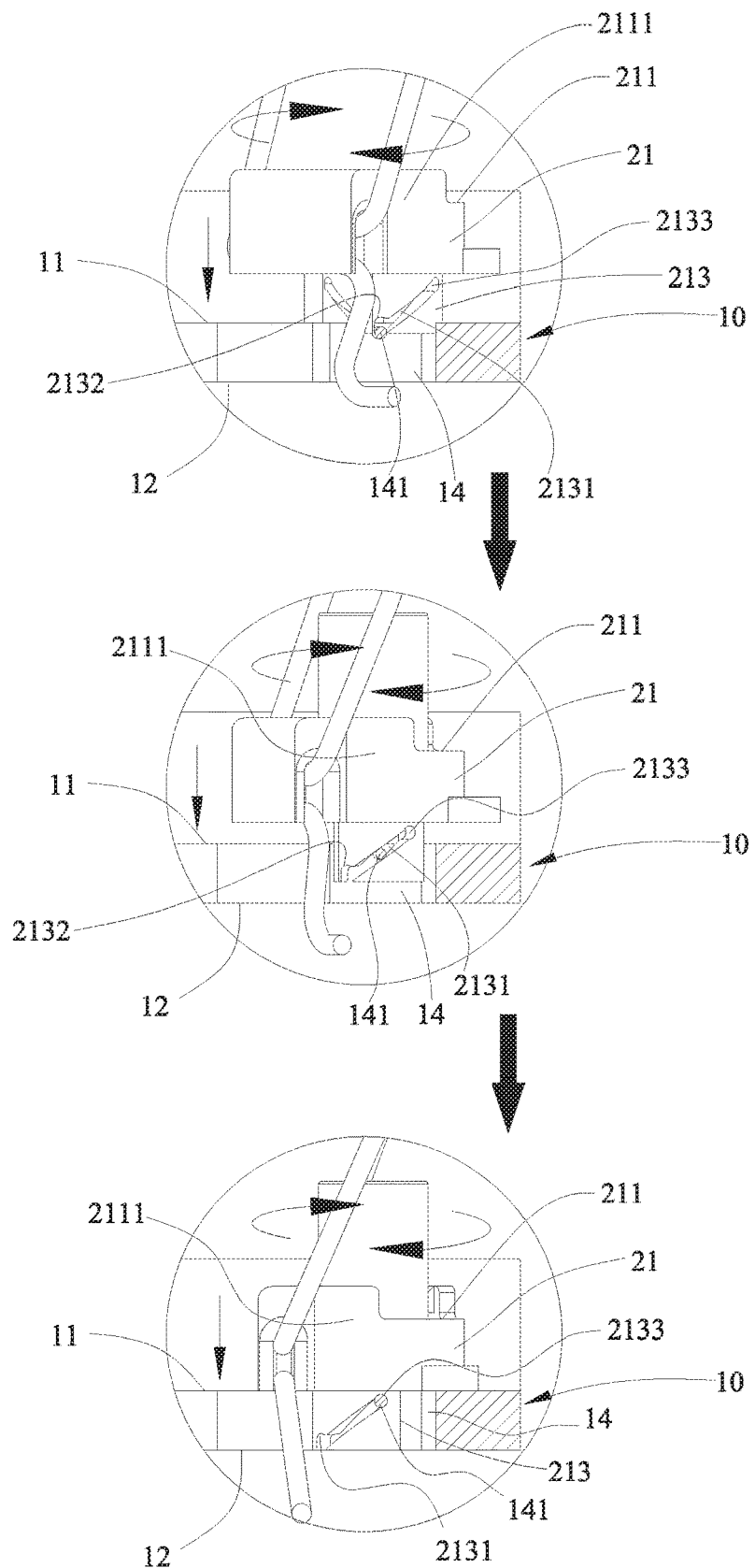
FIG. 3B includes plan views corresponding to the perspective views in FIG. 3A.

Please refer to FIGS. 3A and 3B along with FIGS. 1D and 1E. When the coupling protrusions 213 on the main body 21 of the female fastener holder 20 are aligned and coupled with the coupling holes 14 on the base 10, the main body 21 can be turned. At this point, the engaging elements 141 in the coupling holes 14 are guided by the guiding grooves 2131 on the coupling protrusions 213 to move from the lower recesses 2132 to the upper recesses 2133, so that the coupling protrusions 213 are axially inserted into the coupling holes 14 and the lower side 212 of the female fastener holder 20 is pressed against the upper surface 11 of the base 10. On the other hand, when the main body 21 is turned reversely, the engaging elements 141 are guided by the guiding grooves 2131 to move from the upper recesses 2133 to the lower recesses 2132, so that the coupling protrusions 213 are axially disengaged from the coupling holes 14.

Figure 2D:
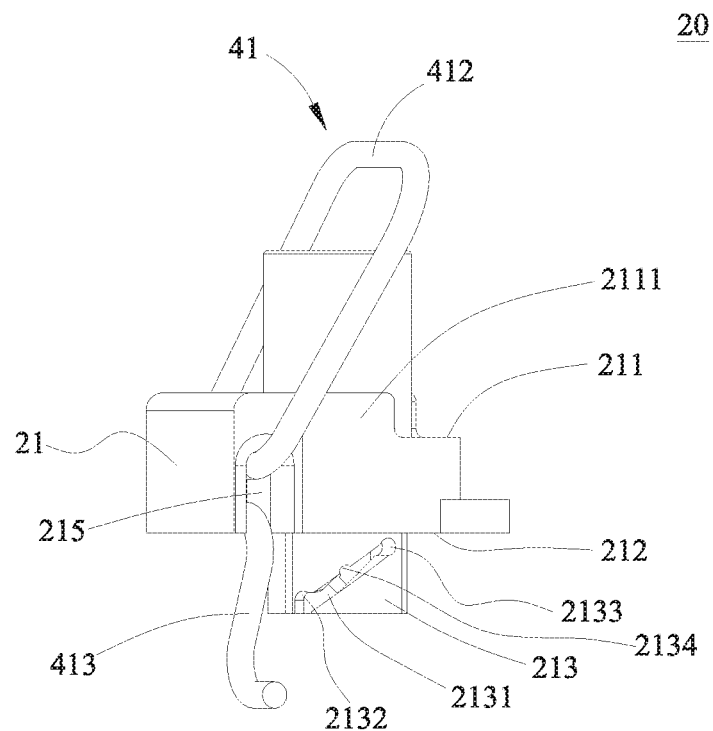
FIG. 2D is a side perspective view of another embodiment of the female fastener holder for fixing structure according to the present invention, which includes a second type of guiding groove.

In another embodiment of the female fastener holder 20 as shown in FIG. 2D, the guiding groove 2131 is provided between the lower and the upper recess 2132, 2133 with at least one middle recess 2134. In this case, when the coupling protrusions 213 of the main body 21 of the female fastener holder 20 are aligned and coupled with the coupling holes 14 on the base 10, the main body 21 can be turned. At this point, the engaging elements 141 in the coupling holes 14 are guided by the guiding grooves 2131 on the coupling protrusions 213 to move from the lower recesses 2132 to the middle recesses 2134, at where the main body 21 pauses before it moves further to the upper recesses 2133. That is, the coupling protrusions 213 are inserted into the coupling holes 14 in a two-step movement. This design allows a user to control the turning state of the female fastener holder 20. In another operable embodiment, the guiding groove 2131 is provided between the lower recess 2132 and the upper recess 2133 with a plurality of middle recesses 2134, so that the coupling protrusions 213 are inserted into the coupling holes 14 in a multi-step movement.

Please refer to FIGS. 2A and 2B along with FIGS. 1A to 1C. The main body 21 of the female fastener holder 20 also has a pivot groove 215 and an elastic element 41 provided thereon. The pivot groove 215 is formed on the lower side 212 of the main body 21 adjacent to one outer edge thereof.

The elastic element 41 includes a pivoting section 411, a handling section 412 and a hooking section 413. The pivoting section 411 is pivotally received in the pivot groove 215. The handling section 412 is extended from an end of the pivoting section 411 and has a free end 414, which is also pivotally received in the pivot groove 215. The hooking section 413 is extended from another end of the pivoting section 411 and can be adjustably swung forward and backward via the handling section 412.

Figure 4A:
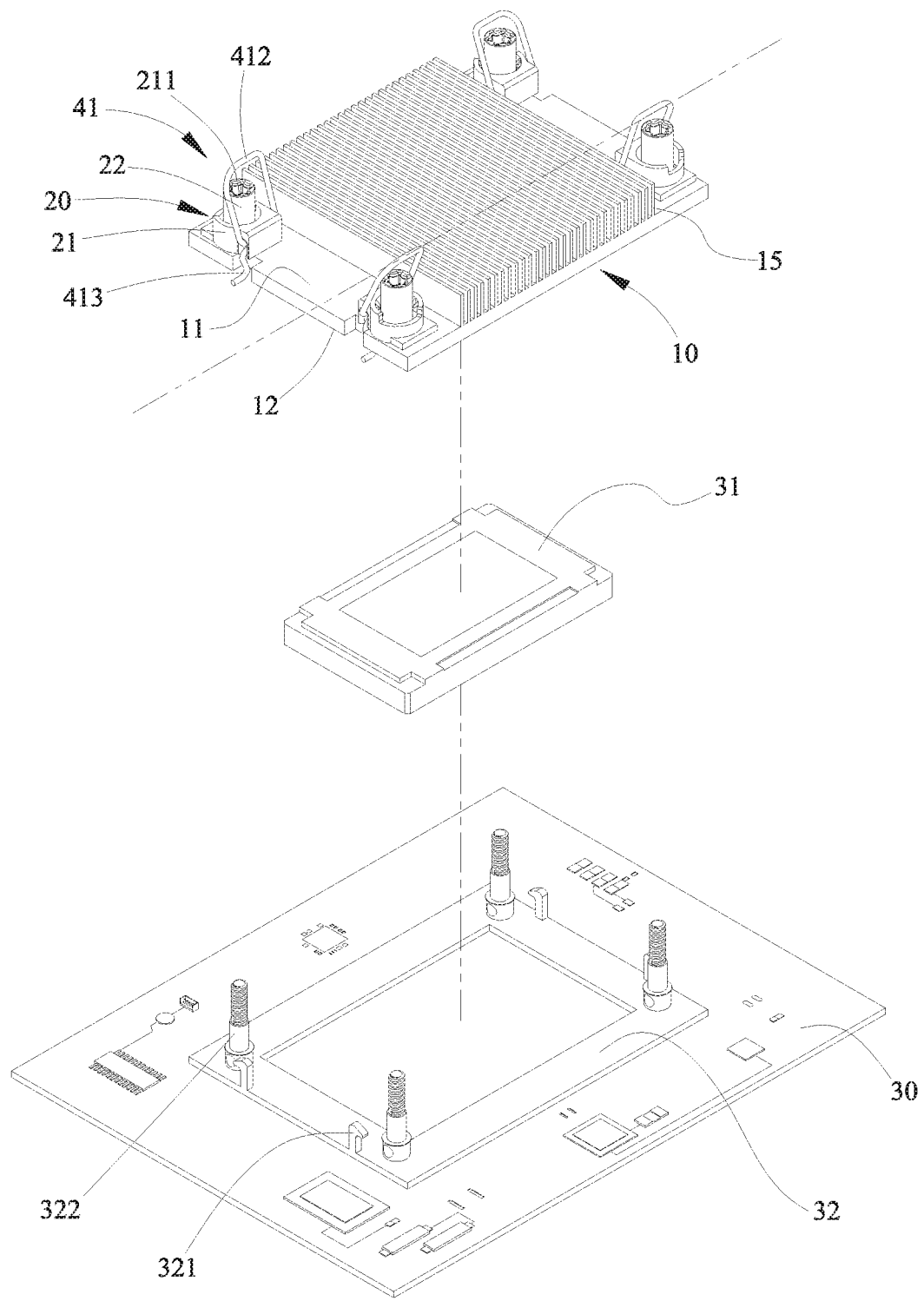
FIG. 4A is an exploded top perspective view showing the mounting of the fixing structure of the present invention to a motherboard.
Figure 4B:
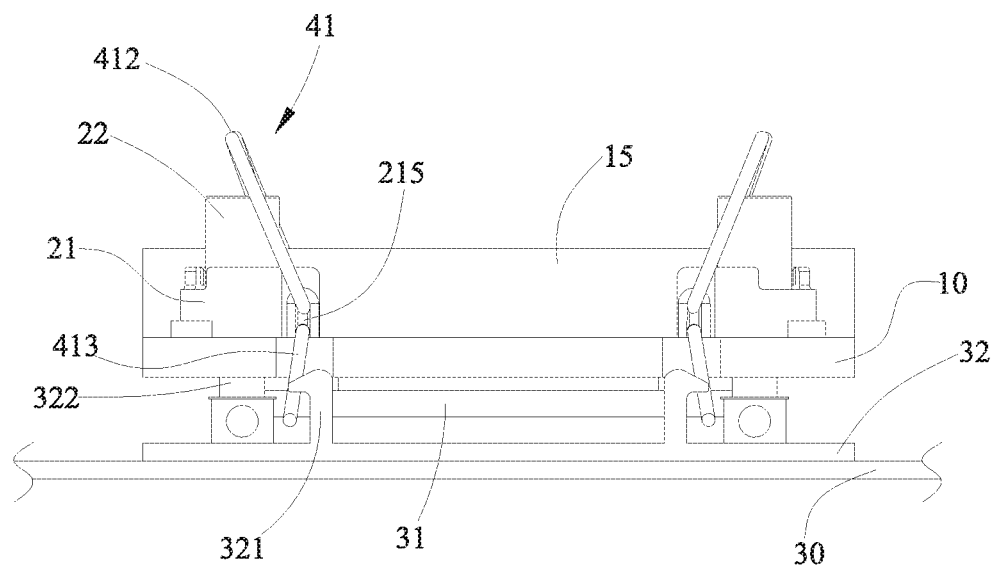
FIG. 4B is an assembled front view showing the mounting of the fixing structure of the present invention to a motherboard.
Figure 4C:
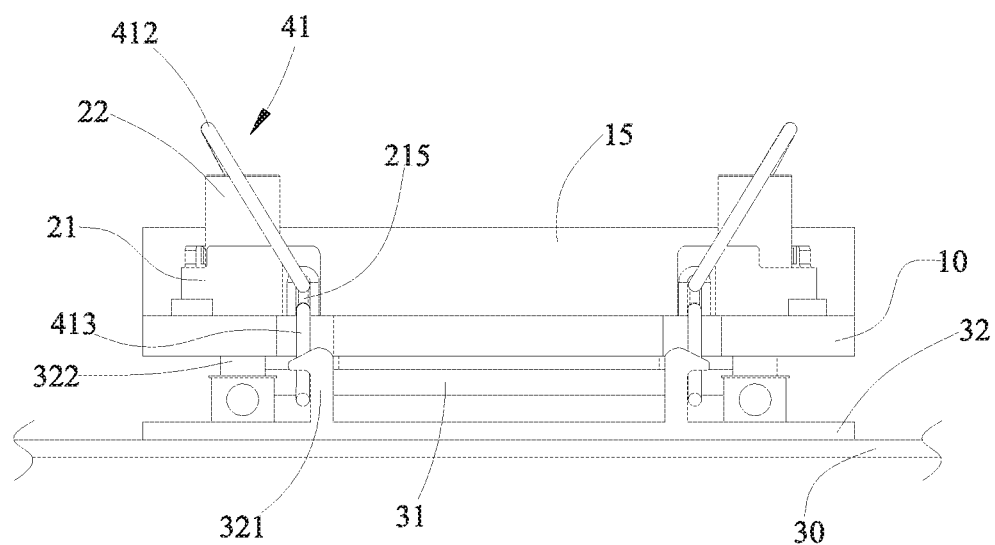
FIG. 4C another assembled front view showing the mounting of the fixing structure of the present invention to a motherboard.

Please refer to FIGS. 4A to 4C that show the mounting of the fixing structure of the present invention to a motherboard or circuit board 30. On the motherboard 30, there is a heat-producing element 31 surrounded by a base frame 32. On the base frame 32, there are a plurality of retaining hooks 321 and a plurality of connecting elements 322. The connecting elements 322 are upward extended from the base frame 32 and respectively have male threads provided on a free end thereof. The connecting elements 322 can be, for example, screw-fastening elements or threaded rods. The base 10 of the fixing structure for heat dissipation assembly according to the present invention is mounted on a top of the base frame 32 of the motherboard 30, such that the connecting elements 322 on the base frame 32 are correspondingly screwed into the internally threaded bores 221 of the female fasteners 22 (such as nuts) held in the female fastener holders 20 through meshing of the male threads on the connecting elements 322 with female threads in the internally threaded bores 221, and the lower surface 12 of the base 10 is brought to fitly attach to the heat-producing element 31 on the motherboard 30. By adjusting the handling sections 412 of the elastic elements 41 to different angular positions, the hooking sections 413 can be swung to engage with the retaining hooks 321 on the base frame 32.

In brief, the present invention provides a fixing structure that can be easily assembled to or disassembled from a heat dissipation assembly, and includes female fastener holders 20 for holding female fasteners (nuts) 22 to a base 10, so that the female fasteners 22 can be fastened to connecting elements (or screw-fastening elements) 322 provided on a motherboard or circuit board 30, allowing the heat dissipation assembly to contact with a heat-producing element 31 on the motherboard or circuit board 30.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fixing structure for heat dissipation assembly, comprising:
a base having an upper surface and a lower surface, and being provided with at least one through bore and a plurality of coupling holes; the at least one through bore axially extending through the upper surface and the lower surface; and the coupling holes being located at two outer sides of the through bore and respectively having an engaging element horizontally disposed therein; and
at least one female fastener holder including a main body having an upper side and a lower side; the main body being formed on the lower side with a plurality of coupling protrusions corresponding to the coupling holes on the base; the coupling protrusions respectively having a guiding groove provided thereon for engaging with the engaging element in the corresponding coupling hole; each of the guiding grooves having two opposite lower and upper ends, at where a lower recess and an upper recess are formed, respectively, such that each of the guiding grooves is radially provided on the coupling protrusion to extend from the lower recess to the upper recess; the engaging elements in the coupling holes being guided by the guiding grooves on the coupling protrusions to move from the lower recesses to the upper recesses when the main body of the female fastener holder is aligned with and turned relative to the through bore and the coupling holes on the base, such that the coupling protrusions are axially inserted into the coupling holes and the lower side of the main body of the female fastener holder is pressed against the upper surface of the base.

2. The fixing structure for heat dissipation assembly as claimed in claim 1, wherein the through bore is formed on each of four corners of the base.

3. The fixing structure for heat dissipation assembly as claimed in claim 1, wherein the main body of the female fastener holder is formed on the upper side with a raised wall portion that encloses a holding space for holding a female fastener therein; the raised wall portion being provided with a plurality of limiting elements for interfering with the female fastener; and the main body having a communicating bore axially extending through the upper side and the lower side to communicate with the holding space, such that a male fastener can be extended through the communicating bore to thread into the female fastener.

4. The fixing structure for heat dissipation assembly as claimed in claim 1, wherein the coupling holes are arcuate in shape, and the coupling protrusions also being arcuate in shape to correspond to the arcuate coupling holes.

5. The fixing structure for heat dissipation assembly as claimed in claim 1, wherein the guiding groove on the coupling protrusion is spirally or obliquely extended from the lower recess to the upper recess.

6. The fixing structure for heat dissipation assembly as claimed in claim 1, wherein the guiding groove is further provided between the lower recess and the upper recess with at least one middle recess.

7. The fixing structure for heat dissipation assembly as claimed in claim 5, wherein the guiding groove is further provided between the lower recess and the upper recess with at least one middle recess.

8. The fixing structure for heat dissipation assembly as claimed in claim 3, wherein the main body of the female fastener holder further has a pivot groove and an elastic element provided thereon; the pivot groove being formed on the lower side of the main body adjacent to one outer edge thereof; the elastic element including a pivoting section, a handling section and a hooking section; the pivoting section being pivotally received in the pivot groove; the handling section being extended from an end of the pivoting section and having a free end, which is also pivotally received in the pivot groove; and the hooking section being extended from another end of the pivoting section.

9. The fixing structure for heat dissipation assembly as claimed in claim 8, wherein the lower side of the base is fitly attached to a heat-producing element on a motherboard; the motherboard having a base frame provided thereon to enclose the heat-producing element therein; the base frame being provided with a plurality of retaining hooks and a plurality of connecting elements; and the retaining hooks being respectively engaged with the hooking section of one of the elastic elements.

10. The fixing structure for heat dissipation assembly as claimed in claim 1, wherein the base further includes a plurality of radiation fins or heat pipes provided on the upper surface.

11. The fixing structure for heat dissipation assembly as claimed in claim 1, wherein the base is selected from the group consisting of a piece of solid heat conducting metal, a vapor chamber and a flat heat pipe; and the vapor chamber and the flat heat pipe internally defining a receiving chamber, in which a wick structure and a working fluid are provided.

12. The fixing structure for heat dissipation assembly as claimed in claim 10, wherein the base is selected from the group consisting of a piece of solid heat conducting metal, a vapor chamber and a flat heat pipe; and the vapor chamber and the flat heat pipe internally defining a receiving chamber, in which a wick structure and a working fluid are provided.

13. A female fastener holder for fixing structure, comprising:
    a main body having:
        an upper side formed with a raised wall portion that encloses a holding space for holding a female fastener therein and is provided with a plurality of limiting elements for interfering with the female fastener;
        a lower side formed with a plurality of coupling protrusions; the coupling protrusions respectively having a guiding groove provided thereon; and the guiding grooves respectively having two opposite lower and upper ends, at where a lower recess and an upper recess are formed, respectively, such that each of the guiding grooves is radially provided on the coupling protrusion to extend from the lower recess to the upper recess; and
    a communicating bore axially extending through the upper side and the lower side to communicate with the holding space, such that a male fastener can be extended through the communicating bore to thread into the female fastener.

14. The female fastener holder for fixing structure as claimed in claim 13, wherein the guiding groove on the coupling protrusion is spirally or obliquely extended from the lower recess to the upper recess.

15. The female fastener holder for fixing structure as claimed in claim 13, wherein the guiding groove is further provided between the lower recess and the upper recess with at least one middle recess.

16. The female fastener holder for fixing structure as claimed in claim 13, wherein the main body further has a pivot groove and an elastic element provided thereon; the pivot groove being formed on the lower side of the main body adjacent to one outer edge thereof; the elastic element including a pivoting section, a handling section and a hooking section; the pivoting section being pivotally received in the pivot groove; the handling section being extended from an end of the pivoting section and having a free end, which is also pivotally received in the pivot groove; and the hooking section being extended from another end of the pivoting section.

* * * * *